United States Patent
Franklin et al.

(10) Patent No.: US 9,928,762 B2
(45) Date of Patent: Mar. 27, 2018

(54) ELECTRONIC DEVICES WITH FLEXIBLE CIRCUIT LIGHT SHIELDS

(71) Applicant: Apple Inc., Cupertino, CA (US)

(72) Inventors: Jeremy C. Franklin, San Francisco, CA (US); Kevin D. Gibbs, San Carlos, CA (US); Amy Qian, San Jose, CA (US); John Raff, Menlo Park, CA (US); Carl R. Peterson, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 838 days.

(21) Appl. No.: 13/770,527

(22) Filed: Feb. 19, 2013

(65) Prior Publication Data

US 2014/0092034 A1    Apr. 3, 2014

Related U.S. Application Data (60) Provisional application No. 61/707,768, filed on Sep. 28, 2012.

(51) Int. Cl.
*G09F 13/04* (2006.01)
*H05K 1/02* (2006.01)
(Continued)

(52) U.S. Cl.
CPC ......... *G09F 13/0413* (2013.01); *H05K 1/028* (2013.01); *H05K 1/0274* (2013.01);
(Continued)

(58) Field of Classification Search
CPC .......... B23P 11/00; B32B 17/06; G06F 3/044;
G09F 13/04; G09F 13/0413; G09G
2300/0434; G09G 2300/0439; G09G
2300/0443; G09G 2300/0447; G09G
2300/0452; G09G 2300/0456; G09G
2300/046; G09G 2300/0465; G09G
2300/0469; G09G 2300/0473;
(Continued)

(56) References Cited

U.S. PATENT DOCUMENTS

| | | |
|---|---|---|
| 6,388,722 B1 | 5/2002 | Yoshii et al. |
| 6,411,353 B1 | 6/2002 | Yarita et al. |

(Continued)

*Primary Examiner* — Grant Sitta
(74) *Attorney, Agent, or Firm* — Treyz Law Group, P.C.; David K. Cole (57) ABSTRACT

Electronic devices may include displays. A display may include backlight structures that generate light and display layers that generate images using the generated light. An electronic device may include an opaque flexible printed circuit that is wrapped around one or more edges of the backlight structures. The opaque flexible printed circuit may prevent light from the backlight structures from reaching other electronic components or escaping from the device. The opaque flexible printed circuit may include signal lines that communicate signals between a printed circuit board and the display. The opaque flexible printed circuit may be a layer of the printed circuit board that extends from an edge of the printed circuit board. The printed circuit board may include an additional flexible extended printed circuit layer that wraps around a surface of the printed circuit board and forms a portion of a conductive shield over that surface.

22 Claims, 10 Drawing Sheets

(51) Int. Cl.
H05K 1/14 (2006.01)
H05K 1/18 (2006.01)

(52) U.S. Cl.
CPC ............ *H05K 1/147* (2013.01); *H05K 1/189* (2013.01); *H05K 2201/10128* (2013.01)

(58) Field of Classification Search
CPC ... G09G 2300/0478; G09G 2300/0482; H05K 1/0274; H05K 1/028; H05K 2201/10128; H05K 1/189; H05K 1/147
USPC .................................................. 345/173–175
See application file for complete search history.

(56) References Cited

U.S. PATENT DOCUMENTS

| | | | |
|---|---|---|---|
| 7,206,037 B2 | 4/2007 | Nishio et al. | |
| 8,188,372 B2 * | 5/2012 | Sato ..................... | H05K 3/4691 174/254 |
| 8,488,335 B2 * | 7/2013 | Yamada ............... | H05K 9/0039 361/818 |
| 2002/0097352 A1 * | 7/2002 | Houdeau ............. | G02F 1/13452 349/58 |
| 2004/0090584 A1 * | 5/2004 | Mai ..................... | G02F 1/13452 349/149 |
| 2004/0130538 A1 * | 7/2004 | Lin ..................... | G02F 1/13338 345/178 |
| 2005/0018102 A1 * | 1/2005 | Hirano ................ | G02F 1/13452 349/58 |
| 2005/0088830 A1 * | 4/2005 | Yumoto .............. | G02F 1/13452 361/749 |
| 2005/0243239 A1 * | 11/2005 | Kondo ................ | G02F 1/13452 349/58 |
| 2006/0139271 A1 * | 6/2006 | Okuda ............... | G02F 1/133308 345/88 |
| 2006/0160421 A1 * | 7/2006 | Dangler ............... | H05K 1/0218 439/607.01 |
| 2007/0222912 A1 * | 9/2007 | Sato ................... | G02F 1/133528 349/58 |
| 2008/0180585 A1 * | 7/2008 | Kubota .................. | G06F 3/041 349/12 |
| 2009/0284946 A1 * | 11/2009 | Yang ................... | H05K 1/0218 361/818 |
| 2010/0026659 A1 * | 2/2010 | Long et al. ........... | 345/174 |
| 2010/0146766 A1 * | 6/2010 | Dabov et al. .................. | 29/428 |
| 2010/0177498 A1 * | 7/2010 | Choi et al. .................... | 362/97.1 |
| 2011/0075374 A1 * | 3/2011 | Kang ................... | H05K 3/4641 361/704 |
| 2011/0120770 A1 * | 5/2011 | Yokonuma .................. | 174/94 S |
| 2011/0149192 A1 * | 6/2011 | Son .................... | G02F 1/133308 349/58 |
| 2012/0092582 A1 * | 4/2012 | Oohira .......................... | 349/58 |
| 2012/0098774 A1 * | 4/2012 | Abe ................... | G02F 1/133308 345/173 |
| 2012/0268904 A1 * | 10/2012 | Chien et al. .................... | 361/749 |
| 2013/0082984 A1 * | 4/2013 | Drzaic ..................... | G09G 3/20 345/204 |
| 2013/0235611 A1 * | 9/2013 | Franklin ................. | G09F 13/04 362/602 |
| 2014/0092338 A1 * | 4/2014 | Miyazaki ............ | G02F 1/13452 349/58 |
| 2014/0133179 A1 * | 5/2014 | Franklin ............. | G02B 6/0093 362/612 |

\* cited by examiner

ELECTRONIC DEVICES WITH FLEXIBLE CIRCUIT LIGHT SHIELDS

This application claims priority to U.S. provisional patent application No. 61/707,768 filed Sep. 28, 2012, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size, weight, electrical grounding, robustness, ease of assembly, and light-tightness are often important considerations in designing electronic devices. If care is not taken, displays may be bulky, may exhibit undesired light reflections, or it may be difficult to replace components of the display.

It would therefore be desirable to be able to provide improved displays for electronic devices.

SUMMARY

An electronic device may be provided with a display. The display may have display layers for displaying images. Backlight structures may be included in the display. The backlight structures may provide backlight that illuminates the display layers in the display that are displaying an image for a user.

The electronic device may include printed circuits such as printed circuit boards and flexible printed circuits. Flexible printed circuits may include flexible printed circuits that are separate from a printed circuit board and/or flexible printed circuits formed from a flexible layer of a printed circuit boards that extends from an edge of the printed circuit board.

The backlight structures and the printed circuit board may generate electromagnetic signals such as light leakage from the backlight structures and electromagnetic interfering signals from the printed circuit board. Flexible printed circuits may be used to prevent this type of light leakage and/or electromagnetic interfering signal from reaching other components in the device or from escaping from the device. Flexible printed circuits that are used as light shields in an electronic device in this way may also provide electrical grounding connections and other electrical connections between components in the device.

A flexible printed circuit may be wrapped around an edge of the backlight structures to form a light shield that prevents light leakage from the backlight structures into other portions of the electronic device. This type of flexible printed circuit that is wrapped around an edge of backlight structures to form a light shield may have an end that is attached to a portion of the display and an opposing end that is attached to a grounding structure. The grounding structure may be a metal support structure such as a metal chassis for the backlight structures or may be a portion of a printed circuit board.

A flexible printed circuit may be an extended layer of a printed circuit board having a portion that is attached to the metal chassis for the display and that forms an electrical grounding connection between the printed circuit board and the metal chassis.

A flexible printed circuit may be an extended layer of a printed circuit board that is wrapped around a surface of the printed circuit board over electronic components on the printed circuit board forming some or all of a electromagnetic shield structure between the electronic components and other components in the device. A flexible printed circuit that is wrapped around a printed circuit board to form a shielding structure in this way may have an end that is attached to an additional flexible printed circuit that is wrapped around an edge of the backlight structures to form a light shield that prevents light leakage from the backlight structures Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
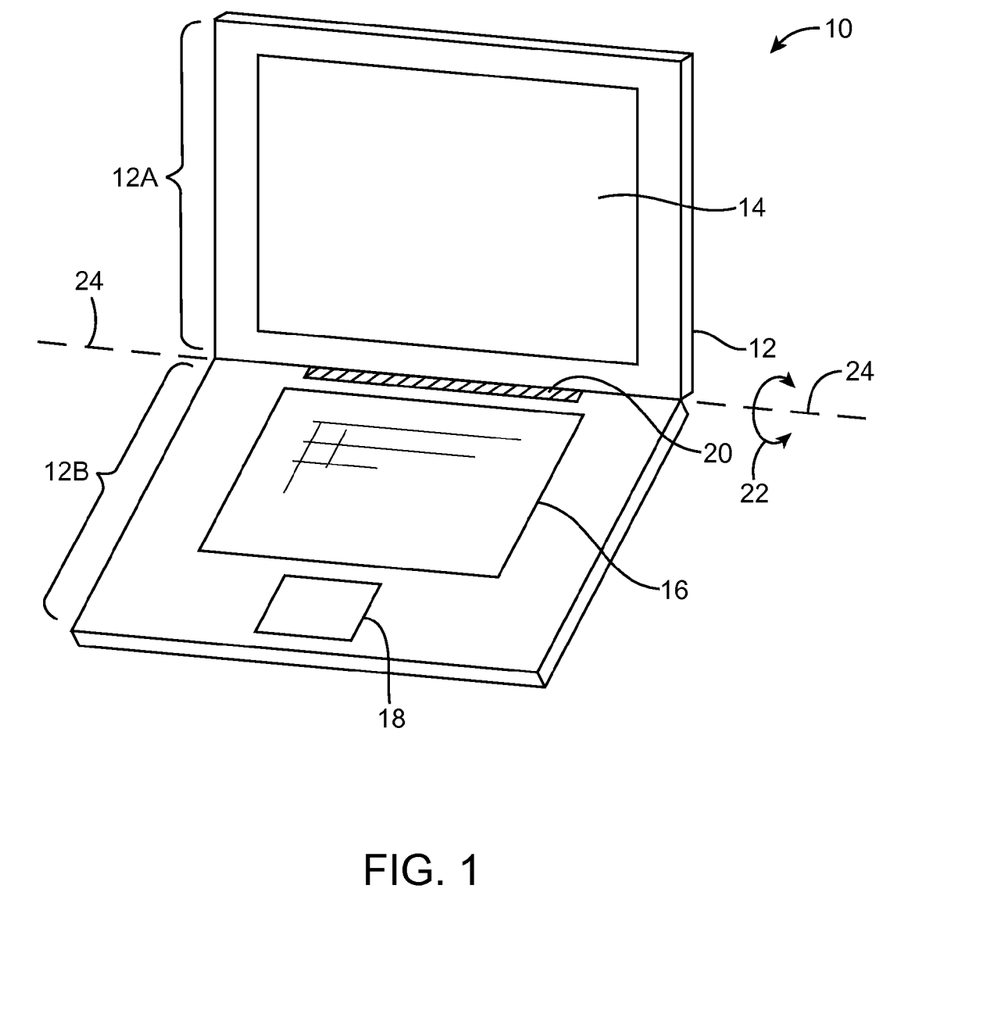
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
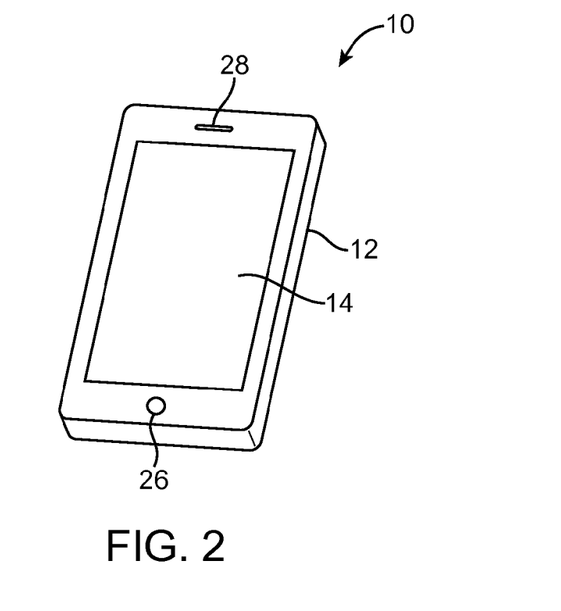
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
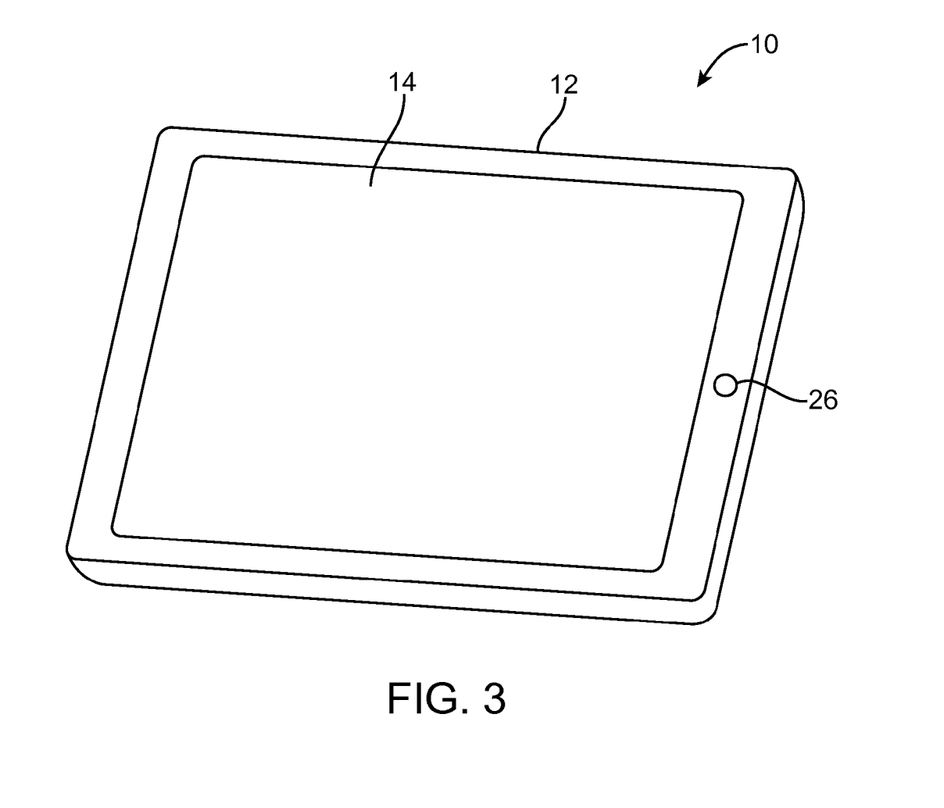
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer with an opening to accommodate button 26 (as an example).

The illustrative configurations for device 10 that are shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined or cast aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use LCD components to form display 14, so configurations for display 14 in which display 14 is a liquid crystal display are sometimes described herein as an example. It may also be desirable to provide displays such as display 14 with backlight structures, so configurations for display 14 that include a backlight unit may sometimes be described herein as an example. Other types of display technology may be used in device 10 if desired. The use of liquid crystal display structures and backlight structures in device 10 is merely illustrative.

A display cover layer may cover the surface of display 14 or a display layer such as a color filter layer or other portion of a display may be used as the outermost (or nearly outermost) layer in display 14. A display cover layer or other outer display layer may be formed from a transparent glass sheet, a clear plastic layer, or other transparent member.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
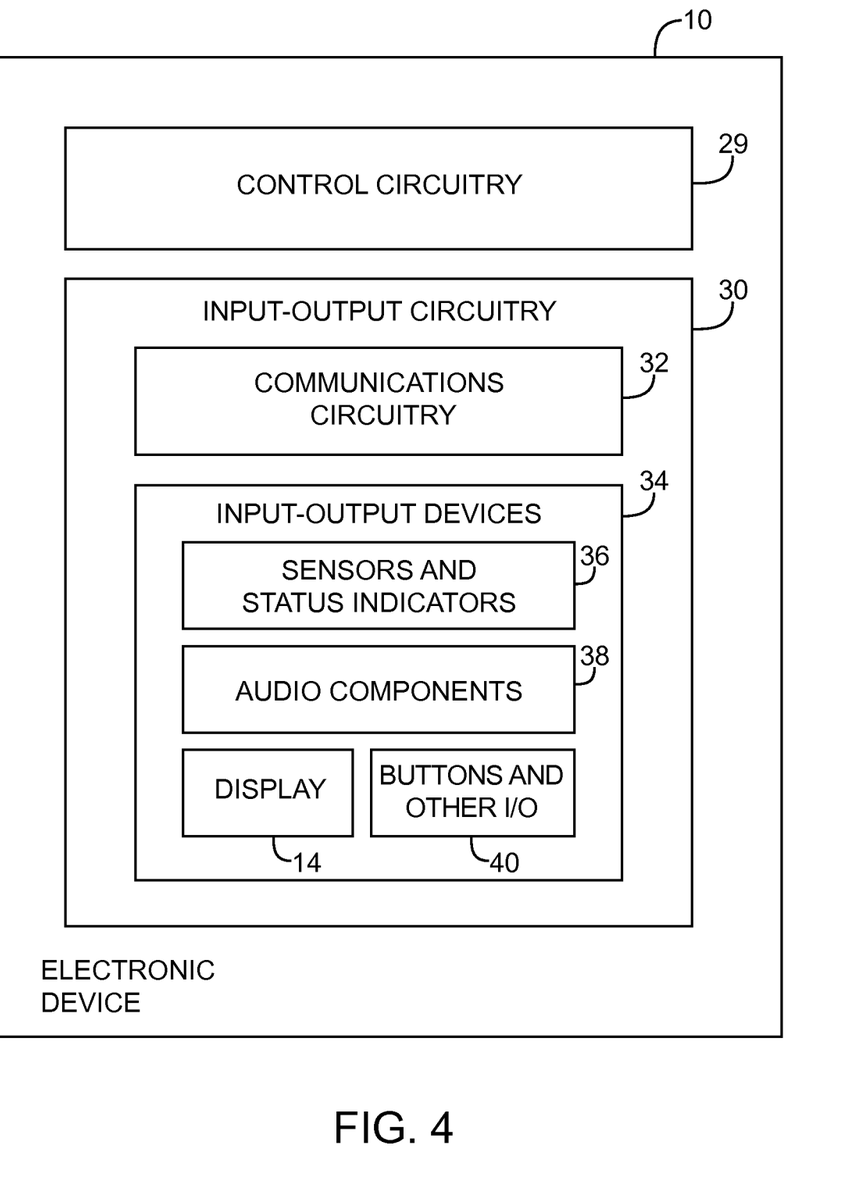
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 29. Control circuitry 29 may include storage and processing circuitry for controlling the operation of device 10. Control circuitry 29 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 29 may include processing circuitry based on one or more microprocessors, microcontrollers, digital signal processors, baseband processors, power management units, audio codec chips, application specific integrated circuits, etc.

Control circuitry 29 may be used to run software on device 10, such as operating system software and application software. Using this software, control circuitry 29 may present information to a user of electronic device 10 on display 14. When presenting information to a user on display 14, sensor signals and other information may be used by control circuitry 29 in making adjustments to the strength of backlight illumination that is used for display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5:
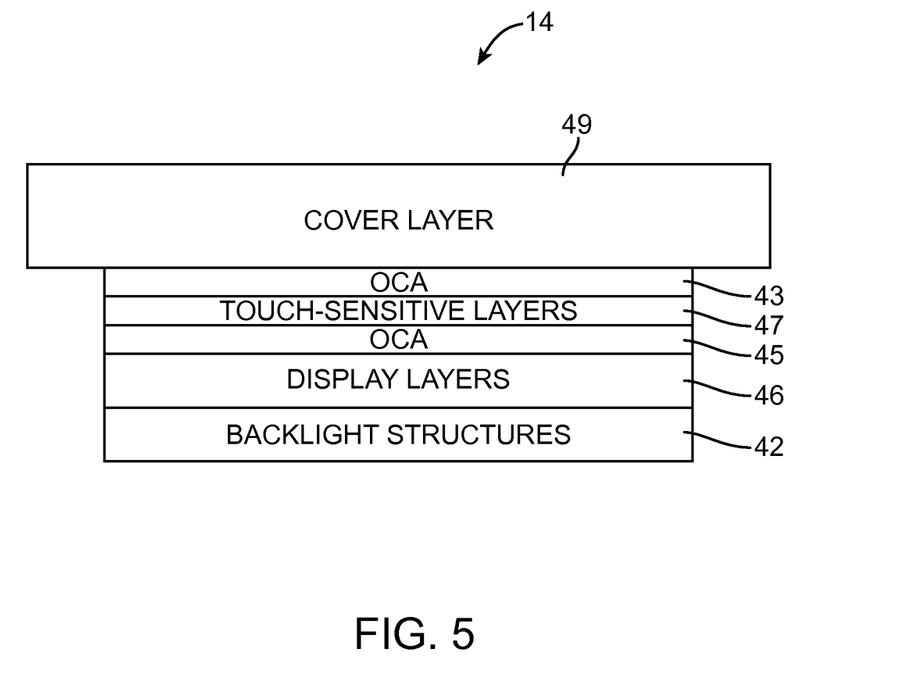
FIG. 5 is a cross-sectional side view of an illustrative display in accordance with an embodiment of the present invention.

A cross-sectional side view of an illustrative configuration that may be used for display 14 of device 10 (e.g., for display 14 of the devices of FIG. 1, FIG. 2, or FIG. 3 or other suitable electronic devices) is shown in FIG. 5. As shown in FIG. 5, display 14 may include one or more layers of touch sensitive components such as touch-sensitive layers 47 that are attached to a cover layer such as cover layer 49. Cover layer 49 may be formed from a sheet of rigid or flexible transparent material such as glass or plastic.

Touch-sensitive layers 47 may be attached to cover layer 49 using an adhesive material such as optically clear adhesive (OCA) 43. Adhesive 43 may be a liquid adhesive, light-cured adhesive, pressure-sensitive adhesive or other suitable adhesive. Touch-sensitive layers 47 may include touch sensor components such as an array of capacitive touch sensor electrodes formed from transparent materials such as indium tin oxide.

Display 14 may include display layers such as layers 46 for generating images to be displayed on display 14. Display layers 46 may include polarizer layers, color filter layers, transistor layers, adhesive layers, layers of liquid crystal material, or other layers for generating display images. Display layers 46 may be attached to touch-sensitive layers 43 using adhesive such as optically clear adhesive 45. Adhesive 45 may be a liquid adhesive, light-cured adhesive, pressure-sensitive adhesive or other suitable adhesive.

Display layers 46 may use light generated by light-generating structures such as backlight structures 42 to form images to be viewed by a user of device 10. Backlight structures 42 may include light-generating components such as light-emitting diodes, light guiding structures, reflective structures, optical films, etc. Backlight structures 42 may be attached to display layers 46 or may be mounted adjacent to layers 46 by attaching backlight structures 42 to one or more structural members.

Figure 6:
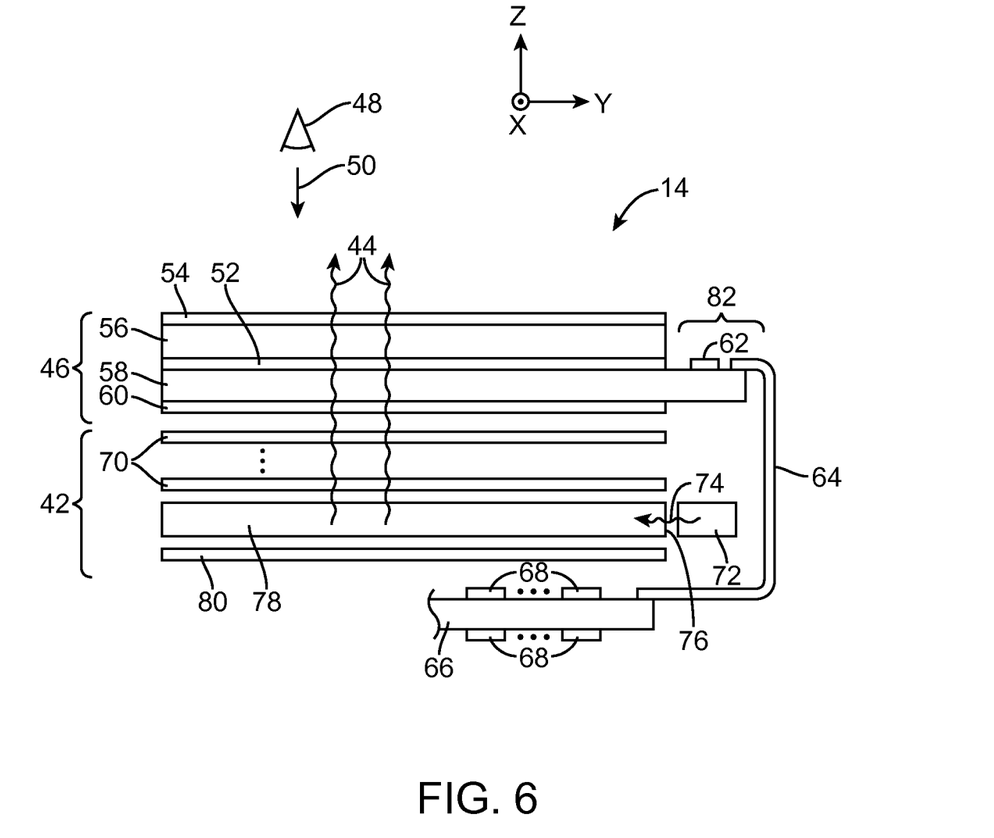
FIG. 6 is a cross-sectional side view of illustrative display layers and backlight structures in accordance with an embodiment of the present invention.

A cross-sectional side view of an illustrative configuration that may be used for display layers 46 and backlight structures 42 of display 14 (e.g., for display layers 46 and backlight structures 42 of the display of FIG. 5, or other suitable display) is shown in FIG. 6. As shown in FIG. 6, display 14 may include backlight structures such as backlight unit 42 for producing backlight 44. During operation, backlight 44 travels outwards (vertically upwards in dimension Z in the orientation of FIG. 6) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54. If desired, upper polarizer layer 54 may be attached to an outer cover layer such as cover layer 49 (FIG. 5).

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry 29 (e.g., one or more integrated circuits such as components 68 on printed circuit 66 of FIG. 6) may be used to generate information to be displayed on display (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. A flexible printed circuit cable such as flexible printed circuit 64 may be used in routing signals between printed circuit 66 and thin-film-transistor layer 58. If desired, display driver integrated circuit 62 may be mounted on printed circuit 66 or flexible printed circuit 64.

Printed circuit 66 may be formed from a rigid printed circuit board (e.g., a layer of fiberglass-filled epoxy) or a flexible printed circuit (e.g., a flexible sheet of polyimide or other flexible polymer layer). However, these examples are merely illustrative. If desired printed circuits 64 and 66 may be formed from a combination of rigid and flexible printed circuit layers (e.g., printed circuit 66 may be formed from a rigid printed circuit board with a layer of flexible printed circuitry that extends from an edge of printed circuit 66 to form flexible printed circuitry 64 that attaches to thin-film-transistor layer 58).

Backlight structures 42 may include a backlight light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed laterally in dimensions X and Y throughout light guide plate 78 due to the principal of total internal reflection. Light guide plate 78 may include light-scattering features such as pits or bumps or other light-scattering structures. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 6, optical films 70 and reflector 80 may have a matching rectangular footprint.

Some portion of light 74 from light source 72 may escape from light guide plate 78, may be reflected from an edge of light guide plate 78, or may otherwise leak away from light source 72. Flexible printed circuits such a flexible printed circuit 64 may be wrapped around an edge of backlight structures 42 so that a portion of light 74 that leaks away from light sources such as light source 72 is blocked from escaping from the display into other portions of device 10. Flexible printed circuit 64 or other light shielding flexible printed circuits in device 10 may be formed from a continuous sheet of opaque flexible printed circuit material to form a complete light blocking flexible printed circuit.

Flexible printed circuit 64 may be attached to ledge 82 using anisotropic conductive adhesive (AFC) or other conductive adhesive. Flexible printed circuit 64 may be attached to printed circuit 66 using AFC, solder, connector structures, or flexible printed circuit 64 may be formed from an integral layer of printed circuit 66 that extends from an edge of printed circuit 66.

Figure 7:
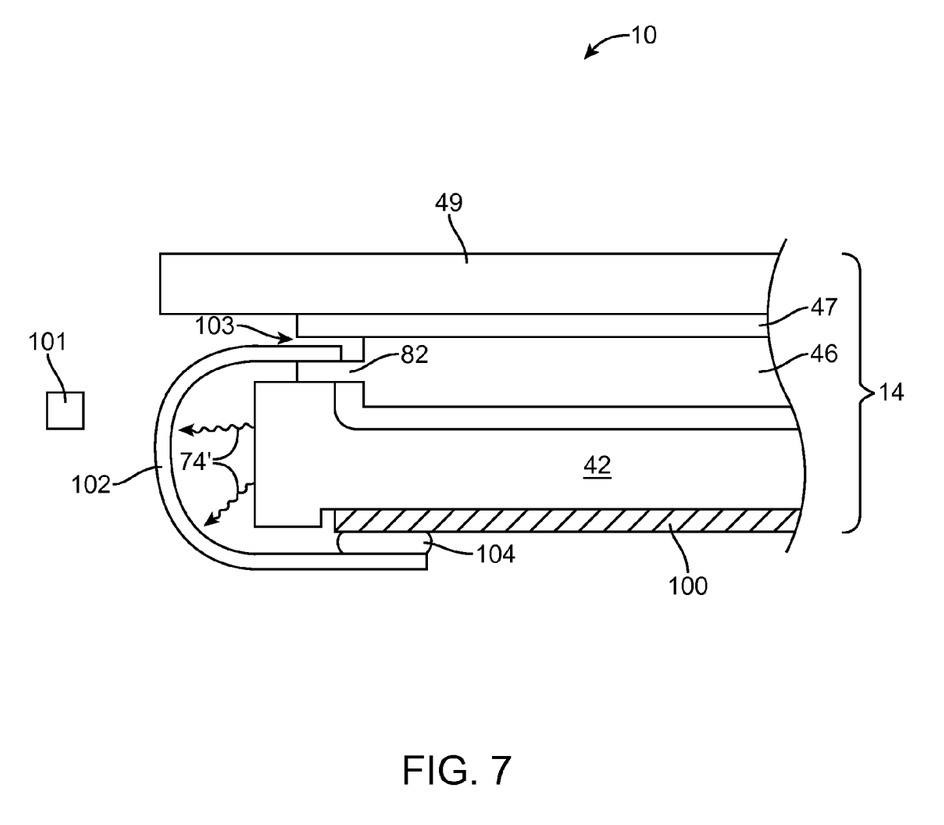
FIG. 7 is a cross-sectional side view of an illustrative flexible circuit light shield that is coupled between display layers and a metal chassis for the display in accordance with an embodiment of the present invention.

As shown in FIG. 7, device 10 may be provided with one or more additional flexible printed circuit light shields such as flexible printed circuit 102 that are separate from other printed circuitry in the device. Flexible printed circuit 102 may be attached to ledge 82 of display layers 46 in gap 103 using anisotropic conductive adhesive (AFC) or other conductive adhesive. Gap 103 may have a thickness (i.e., a minimum distance between touch-sensitive layer 47 and ledge 82) of less than 1 mm, less than 0.5 mm, less than 0.3 mm, between 0.2 mm and 0.3 mm, or between 0.1 mm and 0.5 mm (as examples).

Light such as light 74' that escapes from backlight structures 42 may be prevented from reaching other portions of device 10 by flexible printed circuit 102. Flexible printed circuit 102 may prevent light 74' from reaching other components such as component 101 in device 10. Component 101 may be, for example, an antenna that could be negatively affected by radiation from display 14.

Flexible printed circuit 102 may also provide an electrical connection such as a grounding connection between display layers 46 and a metal support member such as metal chassis 100 for backlight structures 42. Flexible printed circuit 102 may be attached to metal chassis 100 using adhesive 104 (e.g., a conductive pressure sensitive adhesive (PSA)).

In some situations, it may be desirable to replace backlight structures 42 during the lifetime of a device without removing flexible printed circuit 102 from a small gap such as gap 103. In this type of situation, flexible printed circuit 102 may be detached from metal chassis 100, replacement backlight structures may be attached to display layers 46, and flexible printed circuit 102 may be attached to the replacement backlight structures using additional adhesive such as pressure sensitive adhesive. In this way, display 14 may be provided with a light shielding and electrical grounding structure that does not prevent reworking of the display during, for example, manufacturing or repair operations for the device.

Flexible printed circuit 102 may include a conductive layer coupled between display layers 46 and metal chassis 100. The conductive layer may be a continuous conductive layer that is encased in a flexible substrate such as a flexible sheet of polyimide or other flexible polymer layer. Flexible printed circuit 102 may, if desired, extend continuously along and edge of backlight structures 42 so that light 74' is prevented from escaping from substantially all of the edge of backlight structures 42. Display 14 may be provided with a flexible printed circuit light shield such as flexible printed circuit 102 along one, two, three, four, or more edges of display layers 46 and backlight structures 42.

Figure 8:
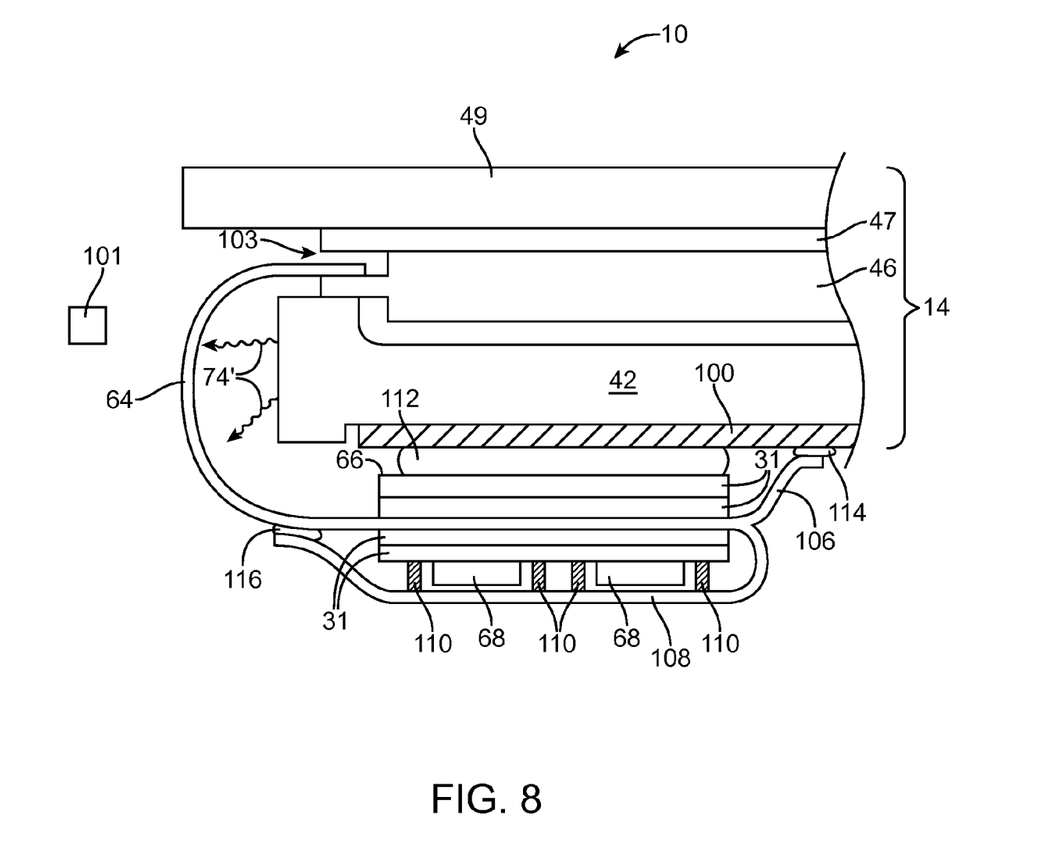
FIG. 8 is a cross-sectional side view of illustrative flexible circuit shielding structures and grounding structures that are formed from an extended flexible layer of a printed circuit board in accordance with an embodiment of the present invention.

As shown in FIG. 8, flexible printed circuit 64 and other flexible printed circuits such as flexible printed circuits 106 and 108 may be formed from one or more extended layers of printed circuit board 66 (e.g., flexible printed circuits 64, 106 and 108 may be extended portions of a common layer of printed circuit board 66 or may be extended portions of two or more layers of printed circuit board 66). Printed circuit board 66 and other printed circuits in device 10 may contain a stack of multiple layers such as layers 31. For example, a printed circuit may contain a combination of both rigid and flexible layers (sometimes referred to as a "rigid-flex" PCB).

A multi-layer printed circuit such as printed circuit 66 may sometimes be referred to as a PCB stack or PCB stack-up. Layers 31 of PCB 66 may be formed from dielectrics such as fiberglass-filled epoxy (e.g., as a rigid layer in a PCB stack) and polyimide (e.g., as a flexible layer in a PCB stack), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester), paper impregnated with phenolic resin, polystyrene, polyimide, polytetrafluoroethylene (PTFE), plastic, other polymers, ceramics, or other suitable dielectrics.

Layers 31 may include attachment layers such as layers of prepreg (i.e., pre-impregnated layers of fiber and resin). Layers of copper or other conductive materials may be formed on the surfaces of layers 31. For example, one or more of layers 31 may have upper and lower surfaces that are covered with a layer of metal such as copper.

Integrated circuits, discrete components such as resistors, capacitors, and inductors, and other electronic components 68 may be mounted to PCB 66. Display driver circuitry 62

(FIG. 6) may receive image data from processing circuitry in PCB 66 (e.g., from integrated circuits such as components 68) and produce corresponding control signals for display 14.

Flexible substrates such as flexible substrates 64, 106, and 108 that extend from an edge of printed circuit board 66 may be used to route signals from PCB 66 to other components in device 10 or may be used to form electrical grounding connections between PCB 66 and other electrical components and conductive structures in device 10. For example, as described above in connection with FIG. 6, flexible printed circuit 64 may be used to route signals from PCB 66 to display driver integrated circuit 62 or directly to thin-film transistor layer 58 from components 68 or other circuitry in PCB 66. Flexible printed circuit 64 may be wrapped around an edge of backlight structures 42 so that light 74' is prevented from escaping from device 10 or from reaching other components such as component 101.

Printed circuit 66 may include additional extended flexible portions such as flexible printed circuit 106 that forms a grounding connection between PCB 66 and metal chassis 100 and/or flexible printed circuit 108 that forms a grounding connection between PCB 66 and flexible printed circuit 64. Flexible printed circuits 106 and 108 may each include a conductive layer. The conductive layers in circuits 106 and 108 may be each encased in a flexible substrate such as a flexible sheet of polyimide or other flexible polymer layer.

Printed circuit 66 may be attached to backlight structures 42 using adhesive material 112. Adhesive material 112 may be a conductive adhesive (e.g., a conductive pressure sensitive adhesive, an anisotropic conductive adhesive or a conductive light curable adhesive) that forms a conductive connection between PCB 66 and metal chassis 100. However, this is merely illustrative. If desired, PCB 66 may be attached to backlight structures 42 using a non-conductive (insulating) adhesive or PCB 66 may be formed separately from backlight structures 42.

Flexible printed circuit 106 may be attached to metal chassis 100 using adhesive 114. Adhesive material 114 may be a conductive adhesive (e.g., a conductive pressure sensitive adhesive, an anisotropic conductive adhesive or a conductive light curable adhesive) that forms a conductive connection between PCB 66 and metal chassis 100. Adhesive 114 and flexible printed circuit 106 may be used to form a conductive ground connection between PCB 66 and metal chassis 100.

In some situations it may be desirable to replace a backlight unit such as backlight unit 42 or to replace display layers 46, cover layer 29 and touch-sensor layer 47 during the lifetime of a device such as device 10 (e.g., during device testing and assembly operations or during device repair operations) without disturbing flexible printed circuit 64 in gap 103. For example, in a drop event, backlight unit 42 may be damaged. In this type of situation, backlight structures 42 may be replaced by detaching PCB 66 and/or flexible printed circuit 106 from backlight structures 42, removing adhesives 112 and 114, removing backlight structures 42 from display layers 46, attaching replacement backlight structures to display layers 46, and attaching PCB 66 and/or flexible printed circuit 106 to the replacement backlight structures using conductive or non-conductive adhesive.

As shown in FIG. 8, flexible printed circuit 108 may extend from one edge of PCB 66 and may be wrapped over a surface of PCB 66 and attached to a conductive surface such as flexible printed circuit 64 (e.g., using adhesive such as conductive adhesive 116) near an opposing edge of PCB 66. Flexible printed circuit 108 may include a continuous conductive layer that passes over the surface of PCB 66. In this way, flexible printed circuit 108 may form at least a portion of a conductive shield (sometimes referred to as a shield can or Faraday cage) over components 68 and PCB 66.

PCB 66 and/or components 68 may generate electromagnetic interference (EMI) in the form of electromagnetic radiation that is emitted from one or more components 68 and/or PCB 66. This type of EMI can, if allowed to propagate into other portions of a device, interfere with the operation of other components in the device such an antenna, a compass, or other electromagnetically-sensitive components. Flexible printed circuit 108 may help contain electromagnetic signals from PCB 66 and/or components 68, thereby preventing these signals from affecting other components in device 10.

Flexible printed circuit 108 may be wrapped around PCB 66 so that a surface of flexible printed circuit 108 is formed in contact with one or more components 68 or PCB 66 may be provided with standoff structures 110 that form conductive contacts with portions of flexible printed circuit 108.

Standoff structures 110 may be formed from conductive materials such as conductive foam or metal (e.g., stainless steel or metal alloys) formed on the surface of PCB 66. Conductive support structures 110 may be formed along one or more edges (or along all edges) of a component so that support structures 110 and a portion of flexible printed circuit 108 form a conductive cover for that component. This type shield can over components 68 formed from members 110 and flexible printed circuit 108 may help prevent EMI from those components from affecting other components and prevent EMI from other components in device 10 from affecting those components that are covered.

Standoff structures 110 may be formed adjacent to the edges of each component 68, adjacent to the edges of some components 68, or along the edges of PCB 66 so that flexible printed circuit 108 and standoff structures 110 form a single shield can that covers substantially all of the surface of PCB 66.

Figure 9:
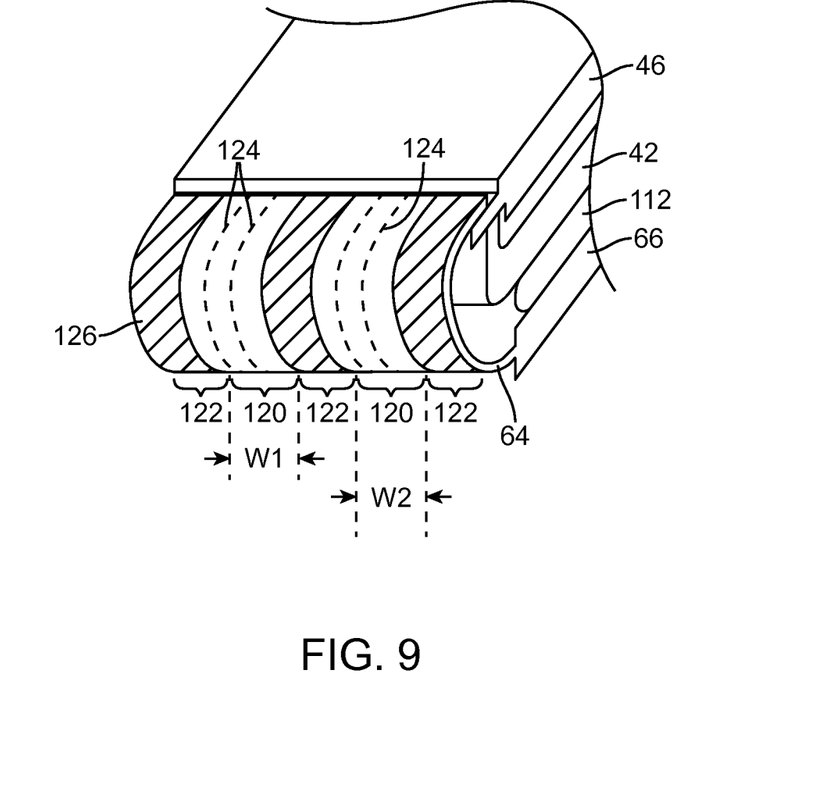
FIG. 9 is a perspective view of an illustrative flexible circuit light shield that is coupled between display layers and a printed circuit board showing how portions of the flexible printed circuit shield may include conductive traces for transmitting signals to the display in accordance with an embodiment of the present invention.

FIG. 9 is a perspective view of flexible printed circuit 64 showing how flexible printed circuit 64 may be formed from a continuous sheet of flexible printed circuitry that extends along substantially all of an edge of backlight structures 42. In this way portions of the light that may leak from backlight structures 42 may be blocked by flexible printed circuit light shield 64.

As shown in FIG. 9, flexible printed circuit 64 may have portions such as portions 120 that contain signal lines for carrying signals between display 14 and PCB 66 and portions 122 that are free of signal lines. Portions 120 of flexible substrate 64 may contain patterned conductive traces 124 (e.g., conductive traces on flexible sheets of substrate such as polyimide sheets). Patterned conductive traces 124 may form signal lines that convey signals from PCB 66 (e.g., from integrated circuits such as components 68) to display circuitry such as display driver circuitry 62 (FIG. 6) or directly to thin-film transistors in layer 58.

Portions 122 of flexible printed circuit 64 may include sheets of opaque material 126 that prevent light from passing through circuit 64. Material 126 may include sheets of conductive material that form an electrical grounding connection between display layer 46 and PCB 66 or may be a non-conductive opaque material. Material 126 may be formed as an inner layer of flexible printed circuit 64 (e.g., a conductive layer that is embedded in a flexible substrate such polyimide), may be formed as an outer layer of flexible printed circuit 64, or may form substantially all of portions 122 of flexible printed circuit 64. Portions 120 may also be formed using opaque material that prevents light from passing through portions 120.

Portions 120 may have respective widths W1 and W2 along the edge of display layers 46. Widths W1 and W2 may be determined by the number of traces 124 to be used in communicating signals between PCB 66 and display layers 46.

In the example of FIG. 9, flexible printed circuit 64 includes two signal line carrying portions 120 and three portions 122 that are free of signal traces. However, this is merely illustrative. If desired, flexible printed circuit 64 may include one portion 120, two portions 120, three portions 120, more than three portions 120 or may be free of signal traces. Flexible printed circuit may include one portion 122, two portions 122, three portions 122, four portions 122, more than four portions 122 or may include signal traces formed along substantially all of flexible printed circuit 64.

Figure 10:
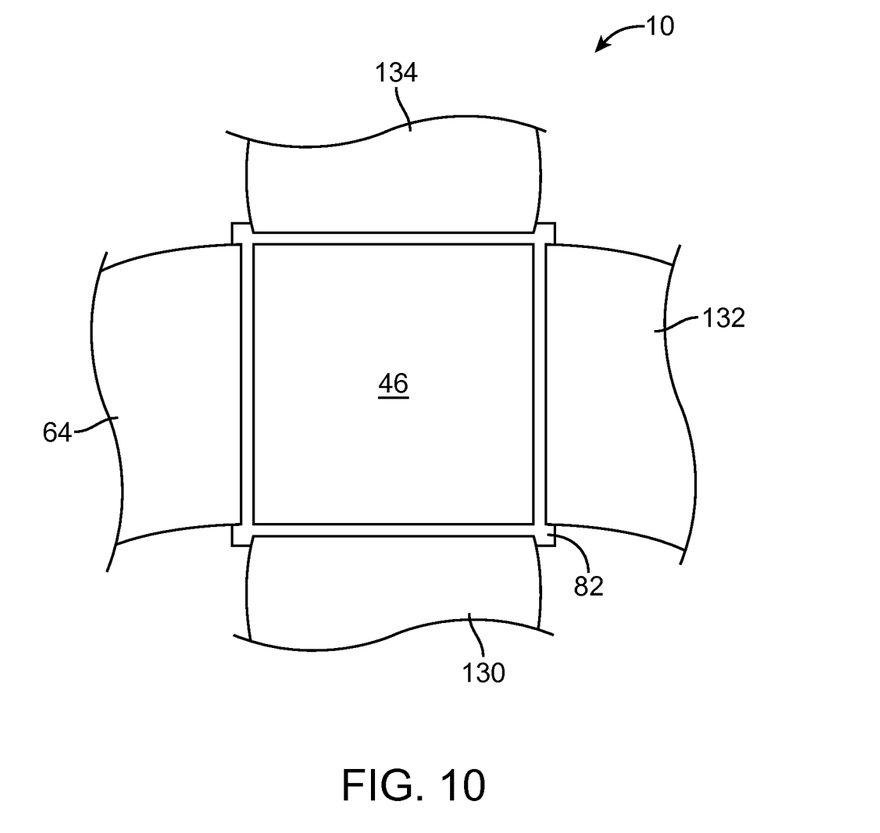
FIG. 10 is top view of illustrative display layers showing how flexible circuit light shield structures may be attached to multiple edges of the display layers in accordance with an embodiment of the present invention.

FIG. 10 is a top view of display layers 46 showing how multiple light shielding flexible printed circuits may be attached to the edges of display layers 46. In the example of FIG. 10, ledge 82 of display layers 46 runs along substantially all of the perimeter of display layers 46 (e.g., along all four edges of display layers 46).

In this configuration, device 10 may include flexible printed circuit light shields such as flexible printed circuits 64, 130, 132, and 134 attached to respective first, second, third and fourth edge portions of ledge 82. However, this is merely illustrative. If desired, ledge 82 may be formed along one, two, three or four edges of display layers 46. If desired, display 14 can have one, two, three, four or more than four flexible printed circuit light shields attached to one, two, three, four or more than four edges of display layers 46. If desired, flexible printed circuit light shields such as flexible printed circuits 64, 130, 132, and 134 may be attached to other portions of display layers 46 or other structures in display 14.

Each of flexible printed circuits 64, 130, 132, and 134 may be formed separately from printed circuit board 66 or may be formed as integral layers of PCB 66.

Figure 11:
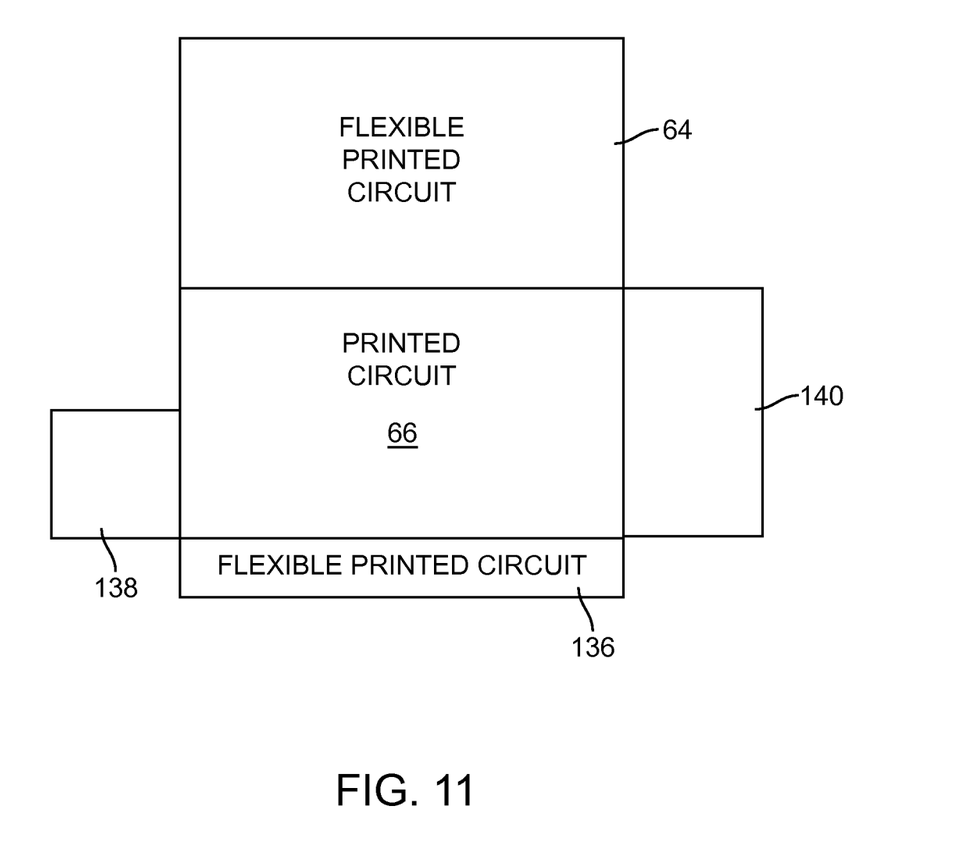
FIG. 11 is a top view of an illustrative printed circuit board having layers extending from multiple edges that form flexible printed circuits that can be used as shielding structures in accordance with an embodiment of the present invention.

As shown in FIG. 11, printed circuit board 66 may be a "rigid-flex" circuit that includes flexible layers that extend from multiple edges of PCB 66 forming multiple corresponding flexible printed circuits. In the example of FIG. 11, PCB 66 includes flexible printed circuits 64, 136, and 140 that extend from respective first, second, and third edges of PCB 66 and span substantially all of that edge of PCB 66. PCB 66 also may include flexible printed circuit 138 that extends from a fourth edge of PCB 66 and spans a portion of that fourth edge. However, this is merely illustrative. If desired, PCB 66 may include flexible printed circuits that extend from one, two, three or more edges of PCB 66. If desired, each flexible printed circuit may span some or all of the edge from which it extends. If desired, any or all of flexible printed circuits 64, 136, 138, and 140 may be attached to a surface of PCB 66 using connectors or conductive adhesive material such as anisotropic conductive adhesive or solder.

Flexible printed circuits 140, 136, and 138 may extend from PCB 66 around portions of display 14 to form flexible printed circuit light shields such as flexible printed circuits 134, 132, and 130 of FIG. 10. If desired, an extended flexible layer of PCB 66 such as one of flexible printed circuits 140, 136, and 138 may be used to form flexible printed circuits 106 and/or 108 of FIG. 8.

The foregoing is merely illustrative of the principles of this invention and various modifications can be made by those skilled in the art without departing from the scope and spirit of the invention.

What is claimed is:

1. An electronic device, comprising:
a display having backlight structures and display layers, wherein the backlight structures are configured to generate light that passes through the display layers during operation of the display; and
a printed circuit board having a plurality of printed circuit layers, wherein the plurality of printed circuit layers include a plurality of rigid printed circuit layers, wherein one of the printed circuit layers is an opaque flexible printed circuit layer that is formed separately from the plurality of rigid printed circuit layers, wherein a first portion of the opaque flexible printed circuit layer extends from an edge of the plurality of rigid printed circuit board layers around an edge of the backlight structures, the first portion of the opaque flexible printed circuit layer has an end that is attached to the display layers, a second portion of the opaque flexible printed circuit layer wraps around and surrounds at least one of the plurality of rigid printed circuit layers, and the second portion of the opaque flexible printed circuit layer has an end that is attached to the first portion.

2. The electronic device defined in claim 1, further comprising an electronic component, wherein the opaque flexible printed circuit layer prevents additional light that has been generated by the backlight structures from reaching the electronic component.

3. The electronic device defined in claim 2 wherein the display layers include a thin-film transistor layer and wherein the end of the first portion of the opaque flexible printed circuit layer is attached to the thin-film transistor layer.

4. The electronic device defined in claim 3 wherein the opaque flexible printed circuit layer includes metal traces that convey signals from the printed circuit board to the thin-film transistor layer.

5. The electronic device defined in claim 3 wherein the display further comprises a touch-sensitive layer.

6. The electronic device defined in claim 5 wherein the opaque flexible printed circuit layer is attached to the thin-film transistor layer in a gap between the thin-film transistor layer and the touch-sensitive layer.

7. The electronic device defined in claim 6 wherein the gap has a thickness of less than 0.5 mm.

8. The electronic device defined in claim 2 wherein the electronic component comprises an antenna.

9. The electronic device defined in claim 1 wherein the backlight structures include a metal chassis and wherein the printed circuit board is attached to the metal chassis.

10. The electronic device defined in claim 1 wherein the plurality of printed circuit board layers further comprises an additional flexible printed circuit layer that extends from an additional edge of the plurality of rigid printed circuit board layers and wherein the additional flexible printed circuit layer has an end that is attached to the backlight structures.

11. The electronic device defined in claim 10 wherein the backlight structures include a metal chassis and wherein the end of the additional flexible printed circuit layer is conductively coupled to the metal chassis.

12. An electronic device, comprising:
a printed circuit board having a plurality of rigid printed circuit board layers;

an electronic component mounted on a first rigid printed circuit board layer of the plurality of rigid printed circuit board layers;

a flexible printed circuit formed separately from the plurality of rigid printed circuit board layers, wherein the flexible printed circuit has a first portion that is interposed between two rigid printed circuit board layers of the plurality of rigid printed circuit board layers, and wherein the flexible printed circuit has a second portion that is wrapped completely around the electronic component and at least one of the rigid printed circuit board layers to form at least a portion of a conductive shield that blocks electromagnetic radiation that is emitted from the electronic component; and conductive standoff structures on the first rigid printed circuit board layer, wherein the conductive standoff structures and the second portion of the flexible printed circuit form the conductive shield.

13. The electronic device defined in claim 12, wherein the electronic component and the first rigid printed circuit board layer are interposed between the first portion of the flexible printed circuit and the second portion of the flexible printed circuit.

14. The electronic device defined in claim 13, wherein the second portion of the flexible printed circuit is conductively coupled to the conductive standoff structures.

15. The electronic device defined in claim 12, further comprising:

a display having backlight structures and display layers.

16. The electronic device defined in claim 15, further comprising:

an opaque flexible printed circuit that extends from an additional edge of the plurality of rigid printed circuit board layers around an edge of the backlight structures, wherein the opaque flexible printed circuit has an end that is attached to the display layers.

17. The electronic device defined in claim 16, wherein the flexible printed circuit is conductively coupled to the opaque flexible printed circuit.

18. An electronic device, comprising:

a display having backlight structures and display layers, wherein the backlight structures are configured to generate light for the display;

a printed circuit board, wherein the backlight structures are interposed between the printed circuit board and the display layers; and first, second, and third flexible printed circuits attached to the printed circuit board, wherein the first flexible printed circuit has an end that is attached to the display layers, the second flexible printed circuit has an end that is attached to the backlight structures, the third flexible printed circuit has a portion that passes over a surface of the printed circuit board and an end that is attached to the first flexible printed circuit, and the portion of the flexible printed circuit that passes over the surface of the printed circuit board completely covers the printed circuit board.

19. The electronic device defined in claim 18 wherein the first flexible printed circuit comprises a continuous sheet of flexible printed circuitry that is wrapped around an edge of the backlight structures.

20. The electronic device defined in claim 18 wherein the portion of the second flexible printed circuit forms a portion of a shield can for the printed circuit board.

21. The electronic device defined in claim 18 wherein the first, second, and third flexible printed circuits each have a portion that forms an integral layer of the printed circuit board.

22. The electronic device defined in claim 10, wherein the edge and the additional edge are opposing edges of the plurality of rigid printed circuit board layers.

* * * * *